United States Patent [19]
Kaneno et al.

[11] Patent Number: 5,644,587
[45] Date of Patent: Jul. 1, 1997

[54] SEMICONDUCTOR LASER DEVICE

[75] Inventors: Nobuaki Kaneno; Syoichi Karakida, both of Itami, Japan

[73] Assignee: Mitsubishi Denki Kabushiki Kaisha, Tokyo, Japan

[21] Appl. No.: 430,800

[22] Filed: Apr. 26, 1995

[30] Foreign Application Priority Data

Apr. 28, 1994 [JP] Japan .................... 6-091257

[51] Int. Cl.⁶ .................................................. H01S 3/19
[52] U.S. Cl. ................................................ 372/45
[58] Field of Search .......................... 372/45, 43, 44, 372/46

[56] References Cited

U.S. PATENT DOCUMENTS 5,339,325  8/1994  Kito et al. ................ 372/45

FOREIGN PATENT DOCUMENTS 1251685  10/1989  Japan .
4372188  12/1992  Japan .

OTHER PUBLICATIONS

Tanbun-Ek et al., "Effects of Strain in Multiple Quantum Well Distributed feedback Lasers", Appl. Phys. Letter, Nov. 1990, vol. 57, No. 21, pp. 2184–2186.

Kimura et al., "Strain Dependence of the Linewidth Enhancement Factor in Long-Wavelength Tensile-and Compressive-Strained Quantum-Well Lasers", IEEE Photonics Technology Letters, Sep. 1993, vol. 5, No. 9, pp. 983–986.

Mathur et al., "Comparative Study of Low-Threshold 1.3μm Strained and Lattice-Matched Quantum-Well Lasers", IEEE Photonics Technology Letters, Jul. 1993, vol. 5, No. 7, pp. 753–755.

Nishi et al., "Optical Characterizations of (111) Oriented InGaAs/InAlAsstrained Quantum Wells Grown on InP Substrates", J. Appl. Phys., Nov. 1991, vol. 70, No. 9, pp. 5004–5009.

Thijs et al., "High Temperature Operation of $\gamma=1.5$ μm Tensile Strained Multiple Quantum Well SIPBH Lasers", Electronics Letters, Feb. 1991, vol. 27, No. 10, pp. 791–793.

Wang et al., "AlInGaAs-AlGaAs Strained Single-Quantum-Well Diode Lasers", IEEE Photonics Technology Letters, vol. 3, No. 1, 1991, 1 Jan.

Hiroshi Ishikawa, "Theoretical Gain of Strained Quantum Well Grown on a InGaAs Ternary Substrate", Applied Physics Letter, vol. 63, No. 6, Aug. 9, 1993.

Thijs et al., "High-Performance $\gamma=1.3$ μm InGaAsP-Inp Strained-Layer Quantum Well Lasers", Journal of Lightwave Technology, Jan. 12, 1994, vol. 12, No. 1, pp. 28–37.

H. Tanaka, "780nm Band TM-Mode Laser Operation of GaAsP/AlGaAs Tensile-Strained Quantum-Well Lasers", Electronics Letters, Sep. 2, 1993, vol. 29, pp. 1611–1613.

Watanabe et al., "High Temperature (77° C.) Operation of 634nm InGaAlp Multiquantum-Well Laser Diodes with Tensile-Strained Quantum Wells", Applied Physics Letters, Sep. 13, 1993, vol. 63, No. 11, pp. 1486–1488.

*Primary Examiner*—James W. Davie
*Attorney, Agent, or Firm*—Leydig, Voit & Mayer

[57] ABSTRACT

A semiconductor laser device includes a semiconductor substrate, upper and lower cladding layers each having a composition lattice-matching with the semiconductor substrate, which lower cladding layer is disposed on the semiconductor substrate, and an active layer having a quantum well structure interposed between the upper and lower cladding layers. The active layer includes alternating well layers and barrier layers and outermost guide layers, and these are arranged so that two of the barrier layers and the guide layers sandwich each well layer. The guide layers lattice-match with the upper and lower cladding layers, and the well layer has a lattice constant different from lattice constants of the two layers sandwiching the well layer, thereby applying a tensile strain to the well layer. The tensile strain reduces the effective mass of holes in the quantum well active layer, resulting in low threshold current, high efficiency, and high-power output.

10 Claims, 11 Drawing Sheets

Fig.3 (a) Prior Art
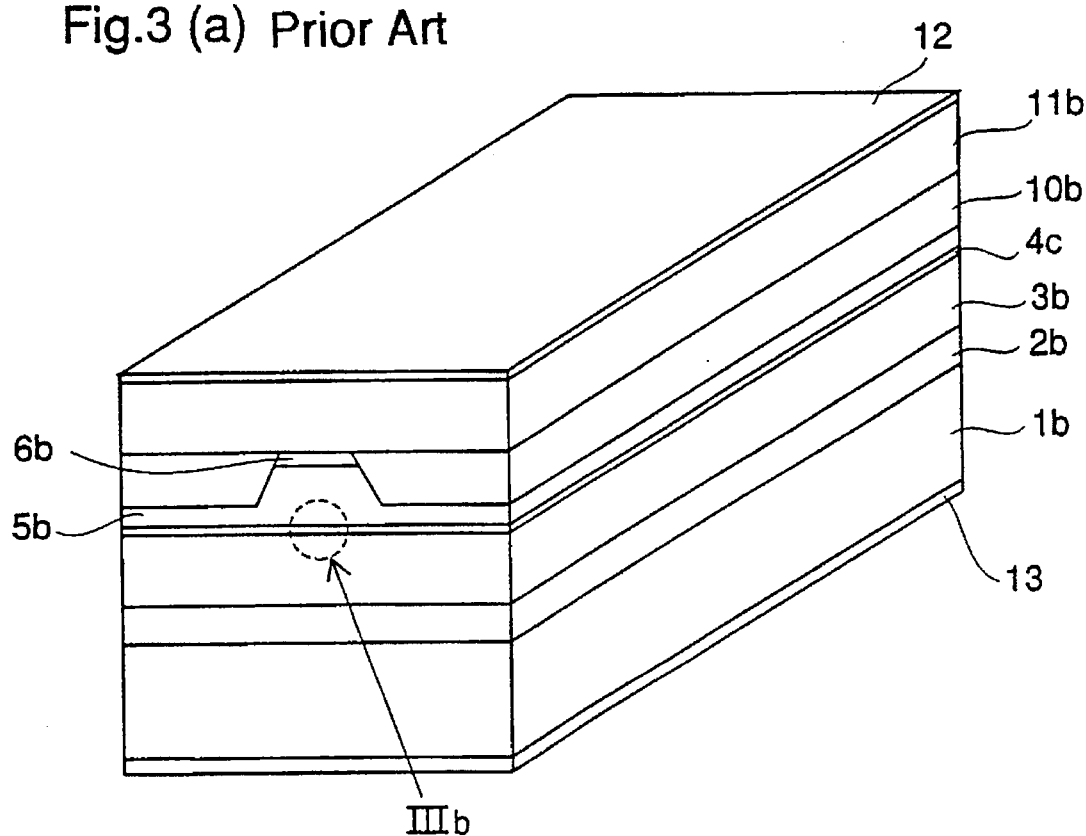
Fig.3 (b) Prior Art
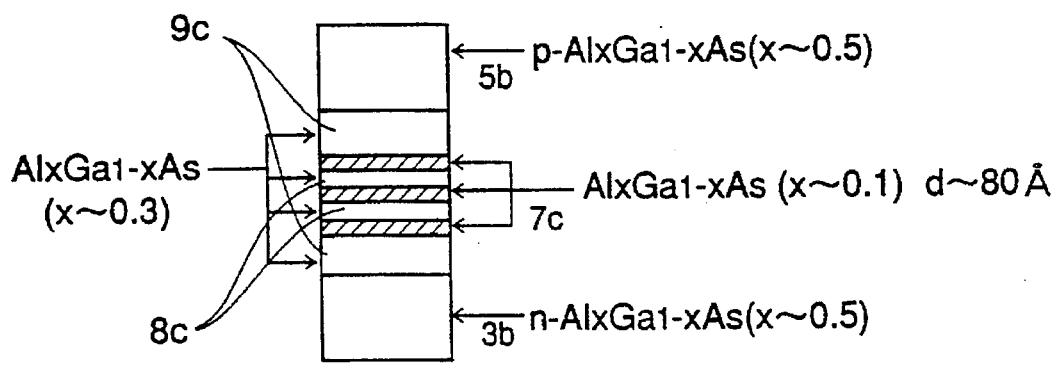

Fig.4 (a) Prior Art
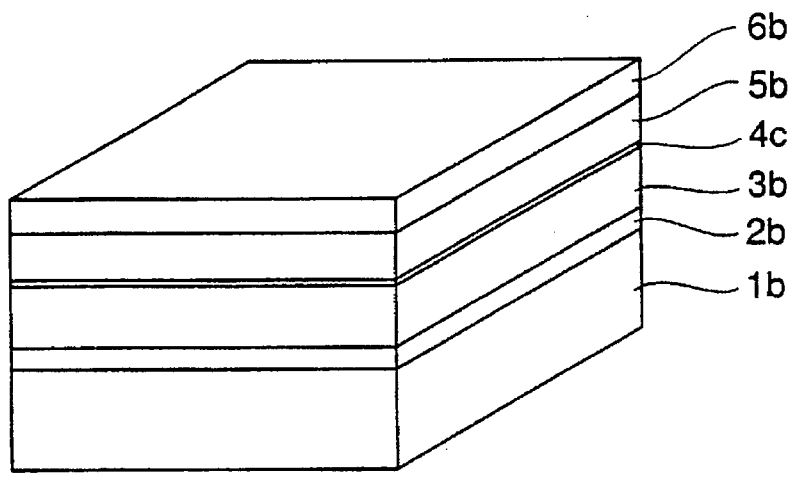
Fig.4 (b) Prior Art
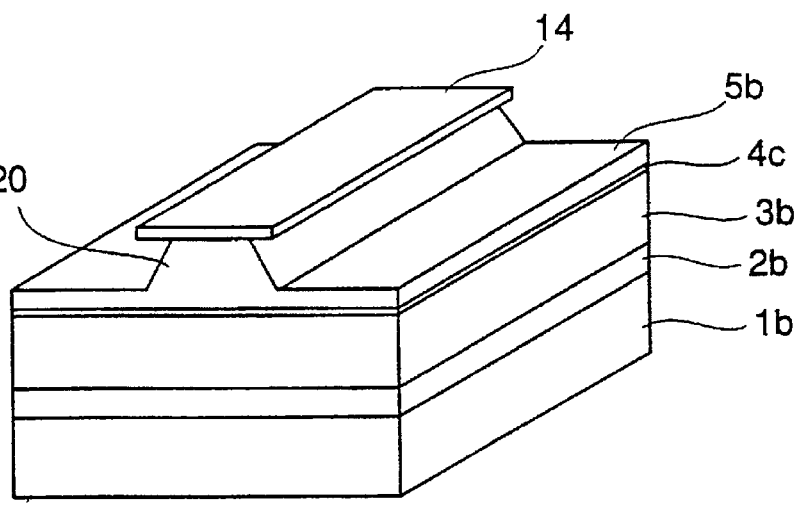
Fig.4 (c) Prior Art
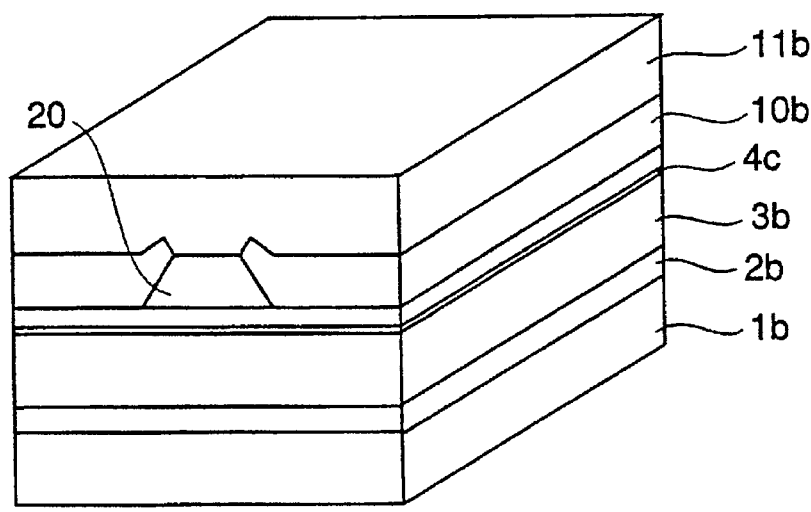

Fig.5 (a) Prior Art
Fig.5 (b) Prior Art
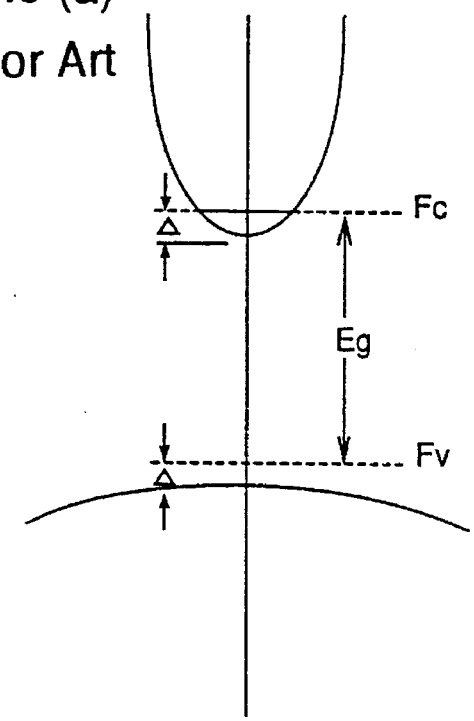
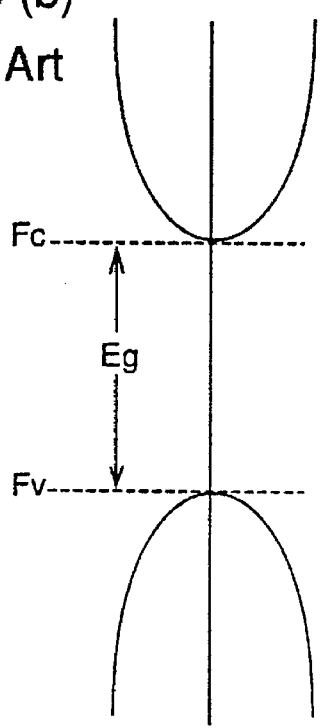
Fig.6 Prior Art
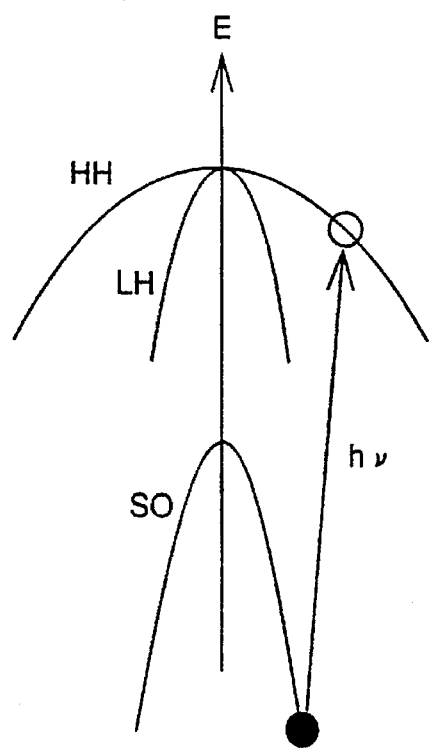

Fig.13 (a) Prior Art
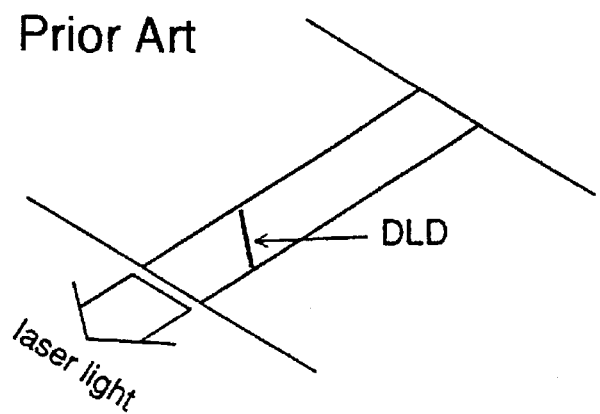
Fig.13 (b) Prior Art
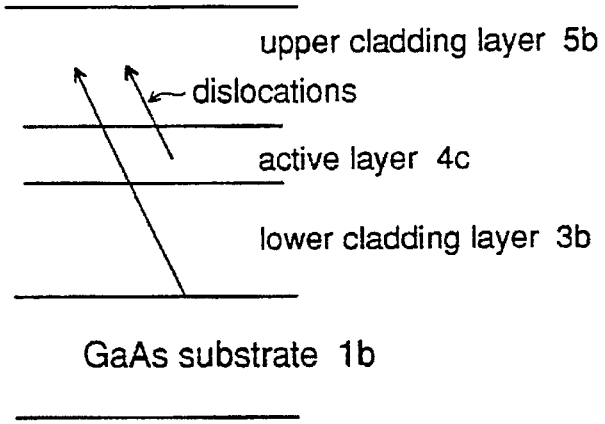
Fig.14
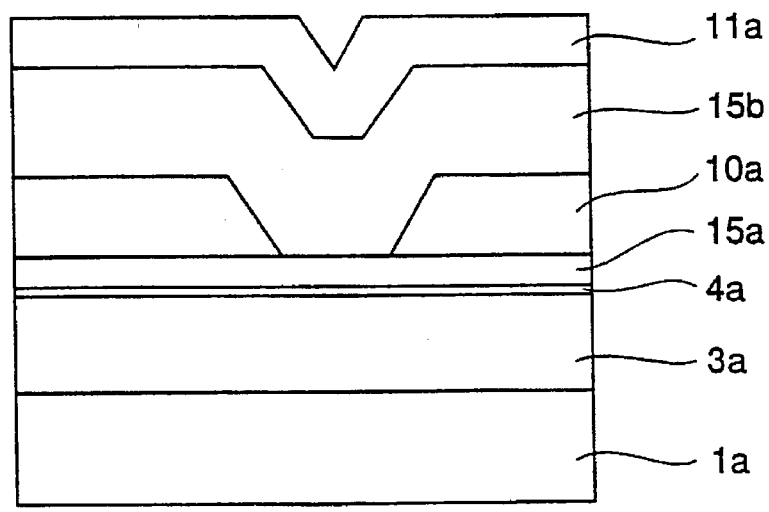

SEMICONDUCTOR LASER DEVICE

FIELD OF THE INVENTION

The present invention relates to a semiconductor laser device and a method for fabricating the laser device and, more particularly, to an increase in the reliability (lifetime) and a reduction in the threshold current of the semiconductor laser device.

BACKGROUND OF THE INVENTION

FIG. 3(a) is a perspective view illustrating a structure of a prior art AlGaAs series semiconductor laser described in "High Power 780 nm AlGaAs Quantum Well Lasers And Their Reliable Operation", *IEEE Journal of Quantum Electronics*, volume 27, Number 6, 1991, pages 1544–1549. FIG. 3(b) is an enlarged view of a portion IIIb of the structure shown in FIG. 3(a). An n type GaAs substrate 16 has opposite front and rear surfaces. An n type GaAs buffer layer 2b is disposed on the n type GaAs substrate 1b. A lower cladding layer 3b comprising n type $Al_xGa_{1-x}As$ (x~0.5) is disposed on the buffer layer 2b. A triple-quantum well active layer 4c comprising three $Al_yGa_{1-y}As$ (y~0.1) well layers 7c, two $Al_zGa_{1-z}As$ (z~0.3) barrier layers 8c, and two $Al_rGa_{1-r}As$ (r~0.3) guide layers 9c are disposed on the lower cladding layer 3b. An upper cladding layer 5b comprising p type $Al_sGa_{1-s}As$ (s~0.5) and having a stripe-shaped ridge is disposed on the triple-quantum well active layer 4c. A p type GaAs cap layer 6b is disposed on the top of the ridge of the upper cladding layer 5b. A current blocking layer 10b comprising n type GaAs is disposed on the upper cladding layer 5b contacting opposite sides of the ridge. A p type GaAs contact layer 11b is disposed on the p type GaAs cap layer 6b and on the n type GaAs current blocking layer 10b. An electrode 13 is disposed on the rear surface of the n type GaAs substrate 1b and an electrode 12 is disposed on the p type GaAs contact layer 11b.

FIGS. 4(a)–4(c) show process steps for fabricating the prior art AlGaAs series semiconductor laser. As shown in FIG. 4(a), the layers from the n type GaAs buffer layer 2b to the p type GaAs cap layer 6b are successively grown on the n type GaAs substrate 1b by MBE (Molecular Beam Epitaxy) or MOCVD (Metal Organic Chemical Vapor Deposition).

A silicon nitride (SiN) film 14 is formed on the p type GaAs cap layer 6b and patterned by photolithography to leave a stripe-shaped portion in the center region on the cap layer 6b. Thereafter, using the stripe-shaped SiN film as a mask, the p type GaAs cap layer 6b and the p type $Al_sGa_{1-s}As$ (s~0.5) upper cladding layer 5b are selectively etched, thereby forming a ridge 20 shown in FIG. 4(b).

Thereafter, an n type GaAs current blocking layer 10b is selectively grown. After removal of the SiN film, a p type GaAs contact layer 11b is grown over the entire surface, completing the structure shown in FIG. 4(c).

The respective layers included in the semiconductor laser have about the same lattice constant and lattice-match with each other. On the other hand, it is described in E. Yablonovitch and E. O. Kane, "Band Structure Engineering Of Semiconductor Lasers For Optical Communications", *Journal of Lightwave Technology*, Volume 6, page 1292, 1988, that, theoretically, laser characteristics are improved when a strain is introduced in the structure by employing an active layer having a lattice constant different from the lattice constants of other layers.

The band structure of a III–V compound semiconductor used in semiconductor lasers is shown in FIG. 5(a). In the Figure, the upper curve represents the conduction band and the lower curve represents the valence band. Characters $F_c$ and $F_v$ represent quasi-Fermi levels and a character $E_g$ represents a forbidden band gap. In this case, the effective mass of a hole in the valence band is much larger than the effective mass of an electron in the conduction band. Therefore, in the band structure of FIG. 5(a), the state density in the vicinity of the top of the valence band is high. In this case, in order to make a laser oscillate, a carrier density that is higher than the carrier density obtained in a band structure where the effective mass of a hole in the valence band is approximately equal to the effective mass of an electron in the conduction band, as shown in FIG. 5(b), is required. Accordingly, in order to reduce the threshold current for laser oscillation, the energy band structure shown in FIG. 5(b) has an advantage over the energy band structure shown in FIG. 5(a). On the other hand, various processes such as inter-valence band absorption and Auger recombination are obstacles to a reduction in the threshold current. The actual valence band comprises a heavy hole band, a light hole band, and a spin orbit split-off band (in FIGS. 6, 7, and 8, referred to as an HH band, an LH band, and an SO band, respectively). In FIGS. 5(a) and 5(b), only the HH band mainly contributing to optical transition is depicted. Inter-valence band absorption is absorption of light due to combination of an electron in the SO band with a hole in the HH band, as shown in FIG. 6. Further, the Auger recombination process comprises two successive steps in which energy due to recombination of an electron in the conduction band (CB) and a hole in the HH band is not emitted as light but dissipated by exciting an electron from the SO band, leaving a hole at the same place. However, if the energy band structure shown in FIG. 5(b) having a small effective hole mass in the valence band is realized, both the inter-valence band absorption and the Auger recombination are suppressed because of the reduction in the carrier density, whereby a reduction in the threshold current and an increase in the output power are promoted. It is clarified theoretically that the band structure shown in FIG. 5(b) can be realized by introducing a compressive strain. In other words, when a compressive strain is introduced into the III–V compound semiconductor, degeneracy in the valence band is eliminated and the top of the HH band providing a valence band of the highest energy (HH1 in FIG. 8) is higher than the HH band in a case where no strain is introduced (dotted line in the Figure), whereby an energy band structure close to FIG. 5(b) is obtained.

There have been various attempts at improving the characteristics of semiconductor lasers employing the compressive strain. First of all, an example of a strained quantum well structure semiconductor laser fabricated on an InP substrate (Ken Kamijyo, Hideaki Horikawa, "Improvement In Characteristics Of A Semiconductor Laser In A Strained Quantum Well Structure", *Journal of Application Physics*, Volume 62, page 134, 1993) will be described. This laser produces light having a wavelength of 1.48 μm directed to applications in optical communications. FIG. 9(b) shows the laser structure. An active layer comprises an InGaAsP multi-quantum well structure shown in FIG. 9(a) and has a lattice constant larger than the lattice constant of InP, the material of the substrate and a cladding layer, whereby a compressive strain is introduced. The saturation output power of this laser is higher than that of a multi-quantum well structure laser having no strain.

Next, an example of a strained quantum well structure semiconductor laser fabricated on a GaAs substrate (C. A. Wang et al., "AlInGaAs—AlGaAs Strained Single- Quantum-Well Diode Lasers," Volume 3, page 4, 1991) will be described. For applications in optical disk devices, a high-output power laser producing light with a wavelength shorter than 1.48 µm or 1.55 µm, which is used in optical communication, is required. An AlGaAs series laser fabricated on a GaAs substrate is such a short-wavelength laser. In this example, an active layer comprises a single quantum well structure in which a compressive strain is introduced into the well layer. More specifically, the active layer comprises a guide layer comprising $Al_yGa_{1-y}As$ (y=0.3~0.7) and a well layer comprising $Al_yIn_xGa_{1-x-y}As$ (x=0.12~0.14, y=0.05~0.17). Thereby, operation in a short wavelength band of 785–890 nm is realized. However, the threshold current and differential quantum efficiency of this prior art laser are approximately equal to those of the AlGaAs series laser. In addition, in a reliability test, the reliability of the prior art AlGaAs series laser was not exceeded.

When a compressive strain is introduced, the energy level of the light hole band is lower than the energy level of the heavy hole band. However, when a tensile strain is introduced, the energy level of the light hole band is higher than the energy level of the heavy hole band, and the contribution of the light hole band to the optical transition becomes large (Tsukuru Ohtoshi, "Strained Quantum Well Laser", Applied Physics, Volume 59, page 1193, 1990). This effect is illustrated in FIG. 10.

With respect to the oscillation mode in the optical transition of a semiconductor laser, the light hole band corresponds to the TM mode and the heavy hole band corresponds to the TE mode. There is a semiconductor laser light amplifier in which an amplification independent of polarization is realized by introducing a tensile strain into an active layer to control the optical transitions in the TE mode and the TM mode. This amplifier is disclosed in the article by Takeshi Kamijou and Hideaki Horikawa. The structure of the amplifier is the same as that shown in FIG. 9(b). In this structure, InP is employed for the substrate and the composition ratios of respective components of InGaAsP in an active layer are controlled to introduce a tensile strain into a quantum well layer. As is apparent from signal gain characteristics shown in FIG. 11, an amplification independent of polarization is realized with a tensile strain of 0.2%. On the other hand, an AlGaAs series semiconductor laser in which a tensile strain is introduced into an active layer is not yet known.

There are three modes of characteristic deterioration in AlGaAs series lasers, i.e., rapid deterioration, gradual deterioration, and sudden i.e., catastrophic, deterioration, sometimes called sudden death, and a main cause thereof is dark line deterioration. A dark line defect produces a non-emission region in the vicinity of dislocations that are grown in an oscillation region of an active layer. Therefore, in order to suppress dark line defect, it is required to suppress proliferation of dislocations from layers other than the active layer and from the substrate to the active layer. It is well known that employing a material including In, such as InGaAs, for the active layer is effective for this purpose. In addition, it is preferable to use a substrate including a reduced density of dislocations. With respect to an LEC (Liquid Encapsulated Czochralski) GaAs substrate, it is well known that the dislocation density can be reduced by two to three orders of magnitude by adding In. However, the In concentration in this case is below 1%.

In the prior art lattice matching AlGaAs series lasers, the energy band structure is an obstacle to a reduction in the threshold current and an increase in the output power. Further, the dark line deterioration reduces reliability.

In order to solve the above-described problems, a strained quantum well structure laser including an InGaAs active layer has been reported and provides reduced threshold current and improved reliability. However, since InGaAs has a narrower energy band gap than AlGaAs, the oscillation wavelength is longer than that of a laser including an AlGaAs active layer. Therefore, this laser is not preferable in view of the reduction in the wavelength of the light produced. Although the article by C. A. Wang et al. suggests an AlInGaAs active layer in order to achieve a short wavelength while preserving the quality of an active layer including In, neither the laser characteristics nor reliability is improved as described above. These two examples introduce a compressive strain into the active layer.

In a case where a compressive strain is introduced, a reduction in effective mass of holes is intended by increasing the curvature in the vicinity of the top of the heavy hole band. However, when a tensile strain is introduced, because the light hole band originally having a small effective hole mass has the highest energy level in the valence band and contributes to optical transitions, it is expected that effects of reducing the threshold current and increasing the output power are the same as in a case where a compressive strain is introduced. However, there is no example that positively utilizes the effects obtained by the introduction of tensile strain. There is only an example in which the optical transitions of the TE mode corresponding to the heavy hole band and the TM mode corresponding to the light hole band are controlled by the semiconductor laser light amplifier with an InGaAsP active layer on the InP substrate to realize an independence of gain and polarization, as described by Ken Kamijou and Hideaki Horikawa.

As means for introducing a tensile strain in an active layer in an AlGaAs series laser, a material containing P as the Group V element has been thought of. However, it is difficult to control accurately both As and P simultaneously in epitaxial growth.

SUMMARY OF THE INVENTION

It is an object of the present invention to provide a short-wavelength AlGaAs series semiconductor laser device with reduced threshold current and increased output power by introducing a tensile strain into an active layer and thereby reducing dark line deterioration.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device includes a semiconductor substrate, upper and lower cladding layers comprising compositions lattice matching with the semiconductor substrate, and a quantum well active layer comprising well layers, barrier layers, and guide layers. The barrier layers sandwich each well layer, and the guide layers are located at the outermost sides and lattice-match with the upper and lower cladding layers. The lattice constant of the well layer of the quantum well active layer is different from the lattice constants of the layers sandwiching the well layer, so that a tensile strain is applied to the well layer. Therefore, a tensile strain laser diode comprising an As series crystal is obtained without using a P series crystal. The tensile strain reduces the effective mass of holes in the quantum well active layer, resulting in low cmcg threshold current, high efficiency, and high-power output. Further, since the semiconductor substrate originally has a low dislocation density, an unwanted increase in dislocations is suppressed to avoid fast deterioration and, furthermore, sudden deterioration and slow deterioration are also suppressed. As a result, a highly-reliable and long-life strained quantum well laser is realized.

According to a second aspect of the prevent invention, in the semiconductor laser device, the lattice constant of the well layer of the quantum well active layer is different from the lattice constants of the barrier layers and the guide layers of the quantum well active layer, whereby a tensile strain is applied to the well layer.

According to a third aspect of the present invention, in the semiconductor laser device, except for the well layer of the quantum well active layer, a dopant is added to the semiconductor substrate, the upper and lower cladding layers, the barrier layers, and guide layers of the quantum well active layer, so that the lattice constant of the well layer of the quantum well active layer is different from the lattice constants of the barrier layers and the guide layers of the quantum well active layer, whereby a tensile strain is applied to the well layer.

According to a fourth aspect of the present invention, in the semiconductor laser device, the semiconductor substrate comprises n type $In_yGa_{1-y}As$ ($0.05 \leq y \leq 0.2$) to which In atoms are added, or an n type $In_yGa_{1-y}As$ ($0.05 \leq y \leq 0.2$) substrate. The upper and lower cladding layers comprise n type $(Al_xGa_{1-x})_{1-y}In_yAs$ ($x\sim0.6$, $y\sim0.1$) lattice matching with the n type InGaAs layer. The barrier layers and the guide layers of the quantum well active layer comprise p type $(Al_xGa_{1-x})_{1-y}In_yAs$ ($x\sim0.6$, $y\sim0.1$) lattice matching with the upper and lower cladding layers, and the well layers of the quantum well active layer comprise $Al_xGa_{1-x}As$ ($0 \leq x\ 0.15$).

According to a fifth aspect of the present invention, in the semiconductor laser device, the lattice constants of the upper and lower cladding layers sandwiching the quantum well active layer are different from the lattice constants of the barrier layers and the guide layers of the quantum well active layer, whereby a tensile strain is applied to the barrier, guide, and well layers of the quantum well active layer.

According to a sixth aspect of the present invention, in the semiconductor laser device, dopant atoms are added only to the barrier layers and the guide layers of the quantum well active layer, not to the semiconductor substrate, the upper and lower cladding layers, and the well layers of the quantum well active layer, so that the lattice constants of the upper and lower cladding layers are made different from the lattice constants of the barrier and guide layers of the quantum well active layer, whereby a tensile strain is applied to the barrier, guide, and well layers of the quantum well active layer.

According to a seventh aspect of the present invention, in the semiconductor laser device, the semiconductor substrate is an n type GaAs substrate, and the upper and lower cladding layers comprise n type $Al_xGa_{1-x}As$ ($x\sim0.5$) that lattice matches with the n type GaAs substrate. The barrier layers and the guide layers of the quantum well active layer comprise p type $(Al_xGa_{1-x})_{1-y}In_yAs$ ($0.3 \leq x \leq 0.5$, $0.05 \leq y \leq 0.15$), and the well layers of the quantum well active layer comprise $Al_xGa_{1-x}As$ ($0 \leq x \leq 0.15$).

According to an eighth aspect of the present invention, in a method of fabricating a semiconductor laser device, initially, a first conductivity type semiconductor substrate doped with dopant atoms and having opposite front and rear surfaces is prepared, and a semiconductor laminated structure is grown on the front surface of the semiconductor substrate. The semiconductor laminated structure includes upper and lower cladding layers doped with dopant atoms and having the same lattice constant, and a quantum well active layer. The quantum well active layer comprises barrier layers and guide layers which are doped with the dopant atoms and well layers which are not doped with the dopant atoms and have a lattice constant different from lattice constants of the barrier layers and the guide layers. Then, a stripe-shaped insulating film is formed on a center portion of the upper cladding layer and, using the insulating film as a mask, the semiconductor laminated structure is selectively etched to form a ridge, leaving portions of the upper cladding layer at both sides of the ridge. Thereafter, a first conductivity type current blocking layer is grown on the upper cladding layer, contacting both sides of the ridge. After removal of the insulating film, a second conductivity type contact layer is grown on the ridge and on the current blocking layer. Finally, an electrode is formed on the rear surface of the first conductivity type substrate and a second electrode is formed on the contact layer, completing a semiconductor laser device in which the lattice constant of the well layer of the quantum well active layer is different from the lattice constants of the barrier and guide layers sandwiching the well layer, whereby a tensile strain is applied to the well layer of the quantum well active layer.

According to a ninth aspect of the present invention, in a method of fabricating a semiconductor laser device, initially, a first conductivity type semiconductor substrate which is not doped and having opposite front and rear surfaces is prepared, and a semiconductor laminated structure is grown on the front surface of the semiconductor substrate. The semiconductor laminated structure includes upper and lower cladding layers which are not doped with a dopant, and a quantum well active layer. The quantum well active layer comprises barrier layers and guide layers which are doped with the dopant and have lattice constants different from lattice constants of the upper and lower cladding layers, and well layers which are not doped with the dopant. Then, a stripe-shaped insulating film is formed on a center portion of the upper cladding layer and, using the insulating film as a mask, the semiconductor laminated structure is selectively etched to form a ridge, leaving portions of the upper cladding layer at both sides of the ridge. Thereafter, a first conductivity type current blocking layer is formed on the upper cladding layer, contacting both sides of the ridge. After removal of the insulating film, a second conductivity type contact layer is grown on the top of the ridge and on the current blocking layer. Finally, a first electrode is formed on the rear surface of the substrate and a second electrode is formed on the second conductivity type contact layer, completing a semiconductor laser device in which the lattice constants of the barrier layers and the guide layers of the quantum well active layer are different from the lattice constants of the upper and lower cladding layers sandwiching the quantum well active layer, whereby a tensile strain is applied to the well layers of the quantum well active layer.

BRIEF DESCRIPTION OF THE DRAWINGS

FIG. 3(a) is a perspective view illustrating a semiconductor laser device according to the prior art, and FIG. 3(b) is an enlarged view of a part of the structure shown in FIG. 3(a).

FIGS. 4(a)–4(c) are perspective views illustrating process steps in a method of fabricating a semiconductor laser device according to the first embodiment and a semiconductor laser of the prior art.

FIGS. 5(a) and 5(b) are diagrams illustrating an actual energy band structure of a typical III–V group semiconductor and an ideal energy band structure that can easily satisfy the other conditions for laser oscillation of respectively.

FIG. 6 is a diagram illustrating intervalence band absorption.

FIGS. 13(a) and 13(b) are diagrams for explaining the cause of deterioration of a semiconductor laser.

FIG. 14 is a sectional view illustrating a semiconductor laser device having an SAS structure according to a third embodiment of the present invention.

DETAILED DESCRIPTION OF THE PREFERRED EMBODIMENTS

Figure 1:
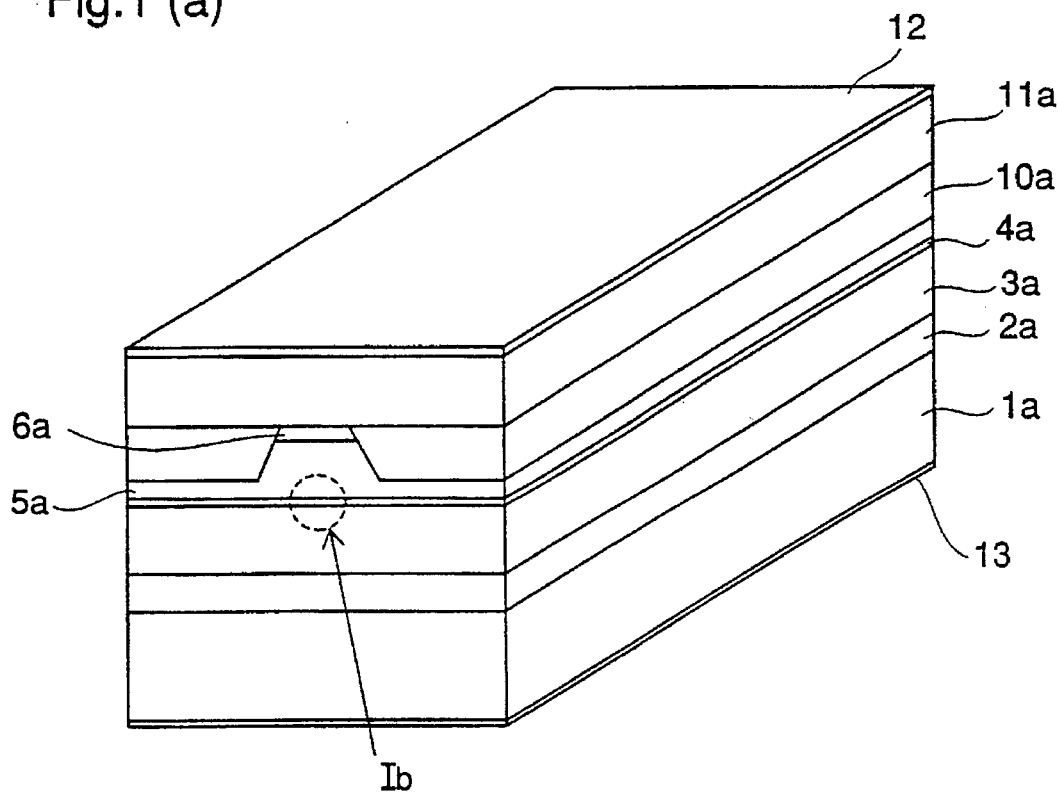
FIG. 1(a) is a perspective view illustrating a semiconductor laser device according to a first embodiment of the present invention.
FIG. 1(b) is an enlarged view of a part of the structure shown in FIG. 1(a).
Figure 1:
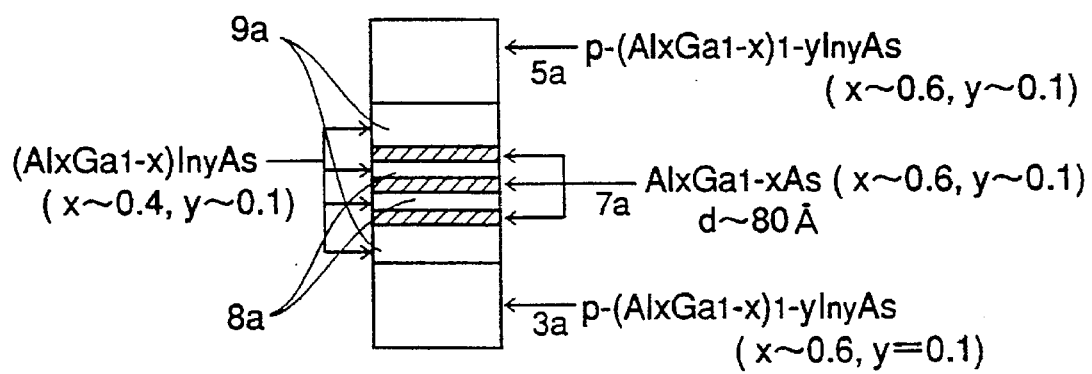

Even when an active layer of a semiconductor laser comprises a material having a lattice constant different from lattice constants of the other layers, if the thickness of the active layer is thinner than a critical thickness, a quasi-stable state including a lattice strain can be realized without generating misfit dislocations. A summary of influence of the strain on the active layer on laser characteristics has already been described. Hereinafter, the principle and the theoretical fundamentals of the present invention are described and a case where a tensile strain is introduced will be considered. Thereafter, preferred embodiments of the present invention are described.

As already described, the energy band structure of a III–V compound semiconductor used for a semiconductor laser device is as shown in FIG. 5(a). In the Figure, the ordinate represents the energy E axis, and the abscissa represents the wave number k axis, and the point of k=0 represents a point on the E axis. The upper curve represents the conduction band and the lower curve represents the valence band. Further, reference characters $F_c$ and $F_v$ represent quasi-Fermi levels, and reference character $E_g$ represents the band gap energy. As is apparent from this Figure, the curvature at the top of the valence band is smaller than the curvature at the bottom of the conduction band. The relationship between E and k in this region is approximately represented as follows:

$$E = E_0 + (hk)^2/(8\pi^2 m^*)$$

where $E_0$ is the energy at the point k=0 (the point at the top of the valence band or at the bottom of the conduction band), h is Planck's constant, and m* is the effective mass of the electron or hole. Because the anisotropy of effective mass has to be considered, the formula actually becomes more complicated. However, in order to facilitate understanding, the effective mass is isotropic in this equation. From this equation, it is apparent that the effective mass is large when the curvature is small. Accordingly, in the energy band structure as shown in FIG. 5(a), the effective mass of a hole in the valence band is significantly larger than the effective mass of an electron in the conduction band. Usually, when the effective mass is large, the state density is high. Accordingly, in this case, the state density in the vicinity of the top of the valence band is high and the quasi-Fermi level $F_v$ rises to the middle of the forbidden band. This means that a carrier density that is higher than a carrier density in an energy band structure where the effective masses of the valence band and the conduction band are approximately equal to each other is required to generate a laser oscillation. Accordingly, in order to reduce the threshold current for laser oscillation, the energy band structure shown in FIG. 5(b) is preferable to the energy band structure shown in FIG. 5(a).

On the other hand, energy dissipation processes, such as inter-valence band absorption or Auger recombination, also prevent a reduction in the threshold current. These processes will be described. Although only a heavy hole band contributing to optical transitions is represented in the valence band in FIGS. 5(a)–5(b), the actual valence band includes a heavy hole band, a light hole band, and a spin orbit split-off band (respectively represented by HH band, LH band, and SO band) as shown in FIG. 6. The main process of the inter-valence band absorption is light absorption due to combination of an electron in the spin orbit split-off band with a hole in the heavy hole band, i.e., excitation of an electron in the spin orbit split-off band to the heavy hole band. In order to absorb light of the energy $E_g$ due to an optical transition between the conduction band and the heavy hole band, the transition should occur in a region spaced from the point wherein the wave number k=0 to some degree, considering the energy gap between those bands. However, since the carrier density is high, as described above, there are some holes in this region in the heavy hole band and absorption is likely to occur. In the transition upon absorption of light, k does not change. Auger recombination comprises two successive processes. The energy produced by the recombination of an electron in the conduction band (CB in the FIG.) and a hole in the heavy hole band does not produce emitted light but the energy produced is dissipated by excitation of electrons from the orbit split-off band to holes located at the same place. From energy conservation and momentum conservation principles, the arrows in the Figure representing these two processes have to be the same in magnitude and opposite in direction. This Auger recombination is also likely to occur when the carrier density is high. Accordingly, if an energy band structure of the valence band as shown in FIG. 5(b) having a relatively small effective mass is realized, the dissipation processes, such as the inter-valence band absorption and the Auger recombination, are suppressed by the reduction in the carrier density, whereby a reduction in the threshold current and an increase in the output power are promoted.

Figure 8:
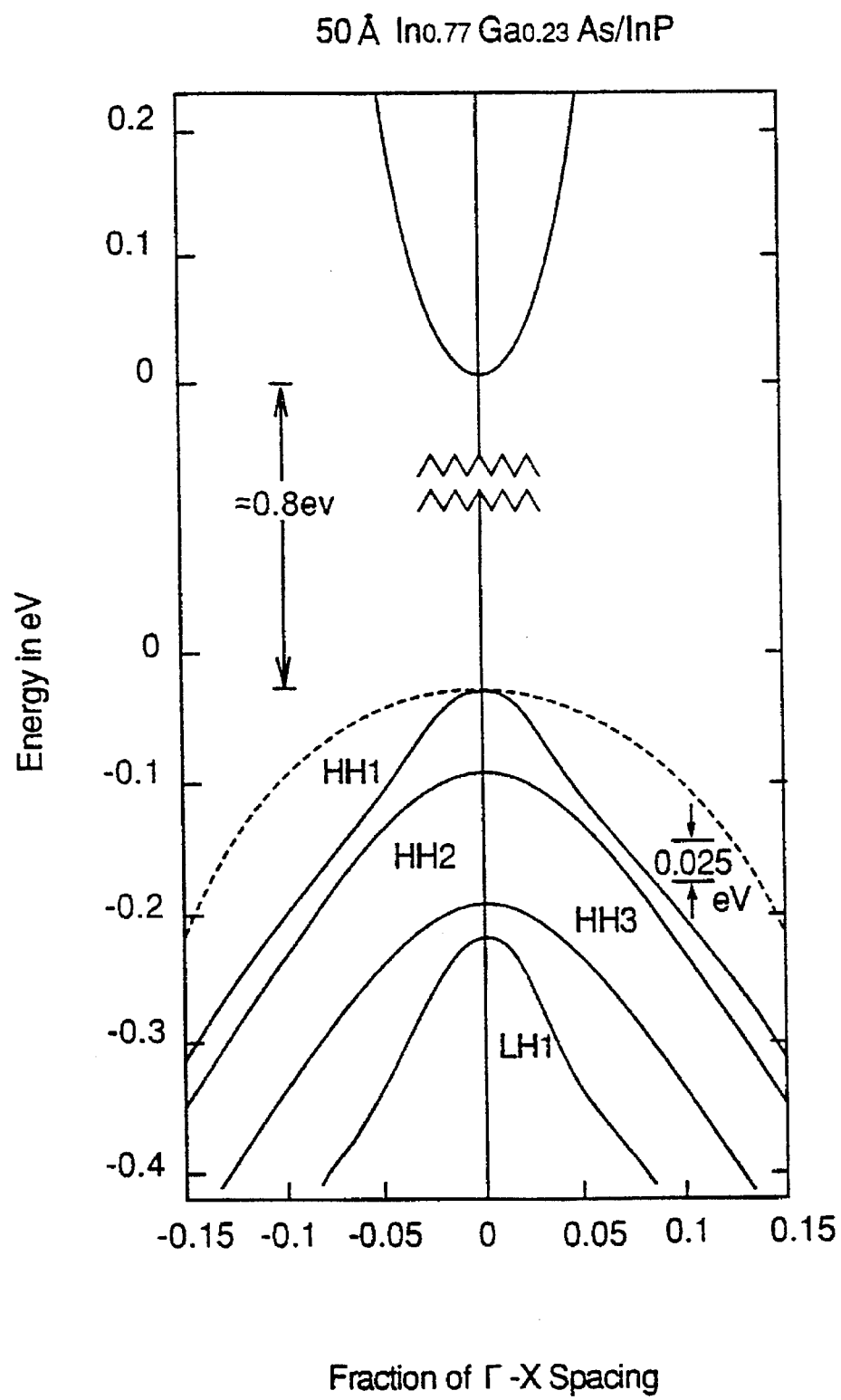
FIG. 8 is a diagram illustrating an energy band structure calculated for an $In_{0.77}Ga_{0.23}As$ single 50 angstrom strained quantum well wherein a dotted line represents an ordinary heavy hole band of $In_{0.53}Ga_{0.47}As$ having the same energy band gap as that of the strained quantum well.
Figure 9A:
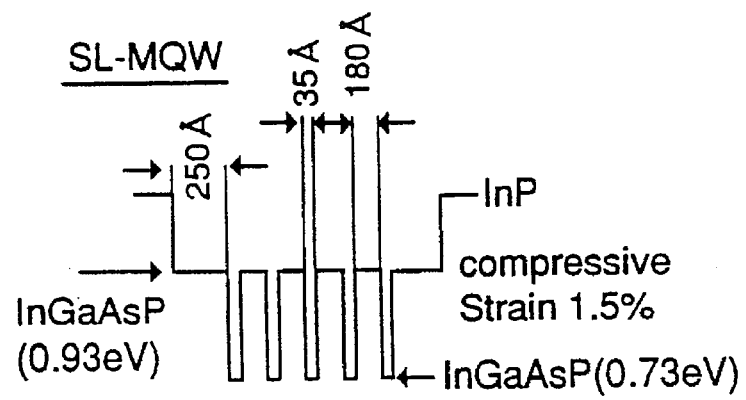
FIGS. 9(a) and 9(b) are, respectively, a schematic diagram of an energy band edge of part of a semiconductor laser and cross a sectional view of a laser structure having a compressively strained quantum well laser including an embedded structure grown by a three-step MOVPE process and including an active layer having an InGaAsP compressively strained quantum well structure.
Figure 9B:
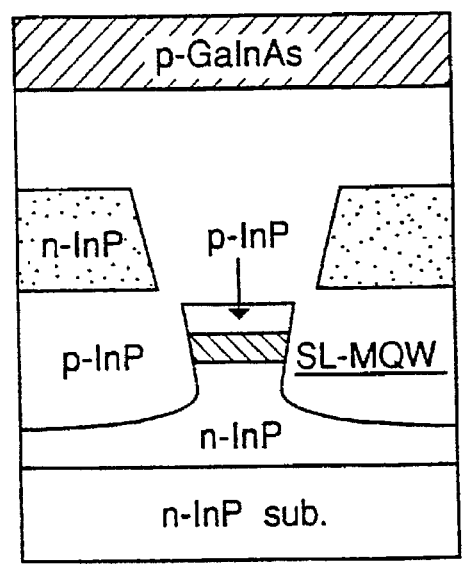

Such a reduction in the effective mass of holes in the valence band is realized by employing a compressive strain. When a compressive strain is introduced into a III-V compound semiconductor, degeneracy in the valence band is avoided and the curvature at the top of the heavy hole band (HH1 in FIG. 10) as a valence band with the highest energy becomes larger than that of the heavy hole band where no strain is introduced (dotted line in the Figure) as shown in FIG. 8. In other words, the effective mass of a hole decreases, resulting in an energy band structure as shown in FIG. 5($b$).

Figure 10:
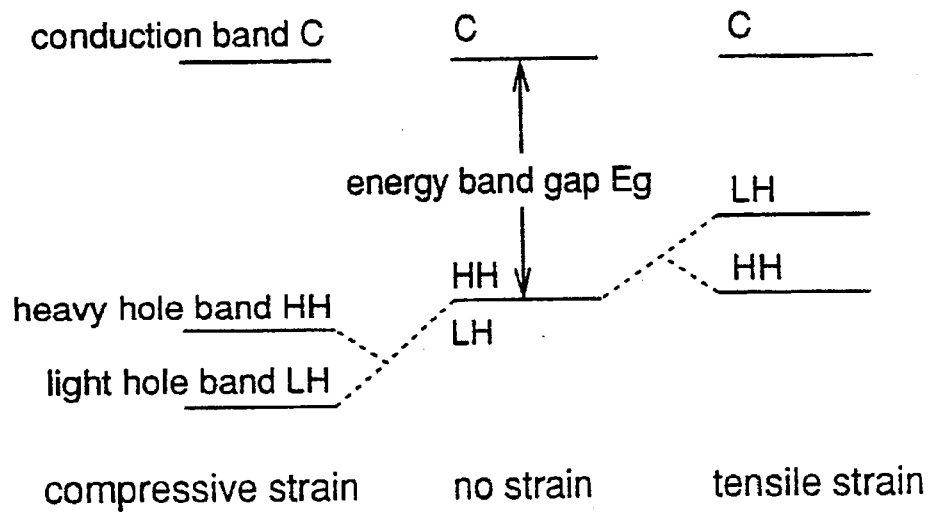
FIG. 10 is a diagram illustrating a variation in the band edge energy due to the strain.
Figure 11:
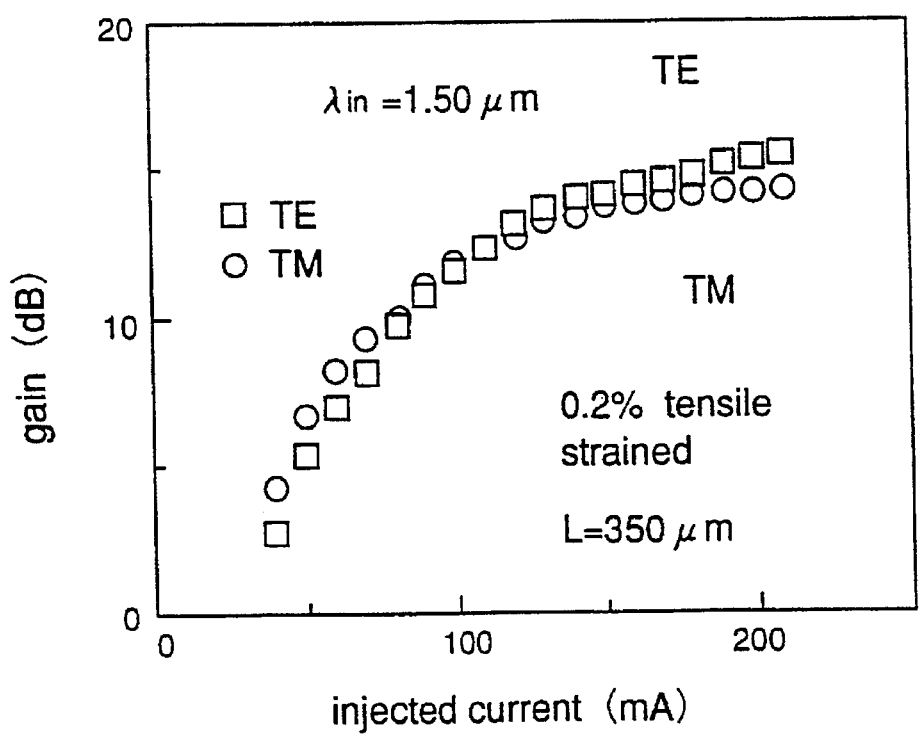
FIG. 11 is a diagram illustrating TE and TM mode signal gain characteristics and polarization independent amplification characteristics of a 0.2% tensile strained quantum well semiconductor laser light amplifier.

Although the energy level of the light hole band becomes lower than the energy level of the heavy hole band when a compressive strain is introduced as described heretofore, when a tensile strain is introduced, the energy level of the light hole band becomes higher than the energy level of the heavy hole band and, in an optical transition, the contribution of the light hole band becomes larger (Tsukuru Ohtoshi, the article cited above). This effect is shown in FIG. 10. When a compressive strain is introduced, a reduction in the effective mass of holes is achieved by increasing the curvature in the vicinity of the top of the heavy hole band. On the contrary, when a tensile strain is introduced, the light hole band, which originally has a relatively small effective hole mass, has the highest energy level in the valence band and contributes to the optical transition, whereby a reduction in the threshold current and an increase in the output power are expected with respect to the laser characteristics as in the case where the compressive strain is introduced.

In the present invention, in an AlGaAs series laser, a $Ga_{1-y}In_yAs$ substrate having an In composition y exceeding 0.01 is employed to introduce a tensile strain into an active layer without adding P, whereby the effective mass of a hole in the valence band is reduced, resulting in a reduction in the threshold current, an increase in efficiency, and an increase in output power. Further, since the substrate originally has a low dislocation density and each layer in the active layer other than the quantum well layer contains In, an unwanted increase in dislocations in the quantum well layer is suppressed and dark line deterioration is reduced, resulting in high reliability. In addition, because the quantum well layer does not include In, the oscillation wavelength is not lengthened, realizing a high-performance and high-reliability short wavelength semiconductor laser. In the fabricating process, since only As is used without using P, a Group V element, an epitaxial growth process having high controllability, which has been used for the prior art AlGaAs series laser, can be employed.

EMBODIMENT 1

FIGS. 1($a$)–1($b$) show a semiconductor laser device according to a first embodiment of the present invention. An n type $Ga_{1-y}In_yAs$ (y=0.1) substrate 1a comprises a GaAs substrate to which In is added. An n type $Ga_{1-y}In_yAs$ (y=0.1) buffer layer 2a having a thickness of 0.5~1.0 μm is disposed on the n type $Ga_{1-y}In_yAs$ (y=0.1) substrate 1a. An n type $(Al_xGa_{1-x})_{1-y}In_yAs$ (x~0.6, y~0.1) lower cladding layer 3a having a thickness of 1.5~2.0 μm is disposed on the n type $Ga_{1-y}In_yAs$ (y=0.1) buffer layer 2a. An active layer 4a having a triple-quantum well structure is disposed on the n type $(Al_xGa_{1-x})_{1-y}In_yAs$ (x~0.6, y~0.1) lower cladding layer 3a. The active layer 4a comprises three $Al_zGa_{1-z}As$ (z~0.1) well layers 7a each having a thickness of 5~10 nanometers, two $(Al_rGa_{1-r})_{1-s}In_sAs$ (r~0.4, s~0.1) barrier layers 8a each having a thickness of 5~10 nanometers, and two $(Al_rGa_{1-r})_{1-s}In_sAs$ (r~0.4, s~0.1) guide layers 9a each having a thickness of 30–60 nanometers.

A p type $(Al_xGa_{1-x})_{1-y}In_yAs$ (x~0.6, y~0.1) upper cladding layer 5a having a thickness of 1.5~2.0 μm is disposed on the triple-quantum well active layer 4a and has a stripe-shaped ridge in the center of the structure. The width of the ridge is 5~7 μm. A p type $Ga_{1-u}In_uAs$ (u=0.1) cap layer 6a is disposed on the ridge of the p type $(Al_xGa_{1-x})_{1-y}In_yAs$ upper cladding layer 5a. The n type $Ga_{1-y}In_yAs$ (y=0.1) current blocking layer 10a is disposed on the p type $(Al_xGa_{1-x})_{1-y}In_yAs$ upper cladding layer 5a, contacting opposite sides of the ridge. A p type $Ga_{1-y}In_yAs$ (y=0.1) contact layer 11a is disposed on the p type $Ga_{1-y}In_yAs$ cap layer 6a and on the n type $Ga_{1-y}In_yAs$ current blocking layer 10a on both sides of the cap layer 6a.

Figure 12:
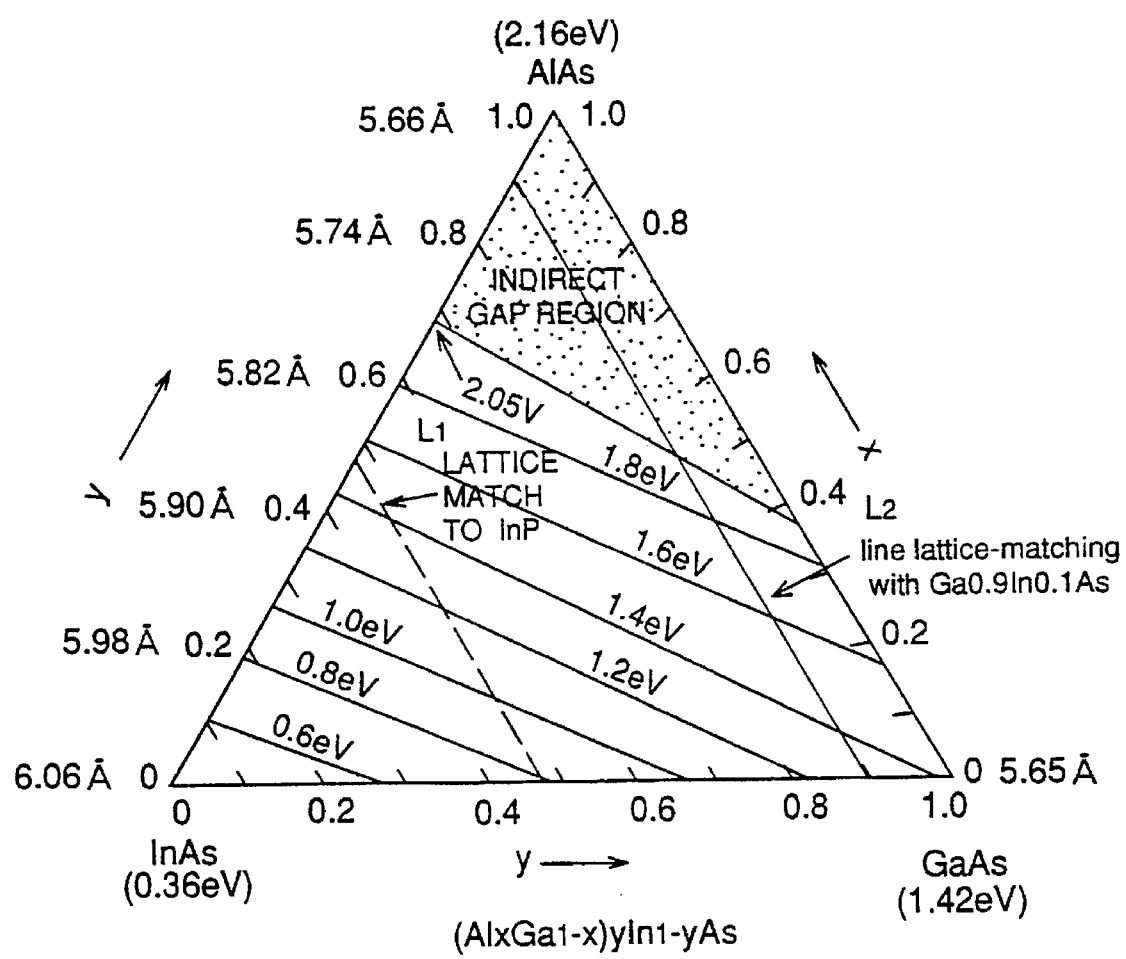
FIG. 12 shows a diagram illustrating an x-y composition plane of $(Al_xGa_{1-x})_{1-y}In_yAs$.

The lattice constants and the band gap energies of the respective layers are found in FIG. 12 showing an x-y composition plane of $(Al_xGa_{1-x})_{1-y}In_yAs$. In FIG. 12, L1 is a line representing compositions lattice matching with InP, L2 is a line representing compositions lattice matching with $Ga_{0.9}In_{0.1}As$, and the dotted region represents an indirect band gap region.

In a method of fabricating a semiconductor laser device according to the first embodiment of the present invention, on the n type $Ga_{1-y}In_yAs$ (y=0.1) substrate 1a, the n type $Ga_{1-y}As$ (y=0.1) buffer layer 2a and having a thickness of 0.5~1.0 μm, the n type $(Al_xGa_{1-x})_{1-y}In_yAs$ (x~0.6, y~0.1) lower cladding layer 3a lattice matching with the n type $Ga_{1-y}In_yAs$ (y~0.1) buffer layer 2a, the quantum well active layer 4a comprising the $(Al_rGa_{1-r})_{1-s}In_sAs$ (r~0.4, s~0.1) barrier layers 8a, the $(Al_rGa_{1-r})_{1-s}In_sAs$ (r~0.4, s~0.1) guide layers 9a, which barrier and guide layers lattice-match with the lower cladding layer 3a, the $Al_zGa_{1-z}As$ (0≤z≤0.15) well layers 7a, the n type $(Al_xGa_{1-x})_{1-y}In_yAs$ (x~0.6, y~0.1) upper cladding layer 5a, and the p type $Ga_{1-y}In_yAs$ (y=0.1) cap layer 6a are successively epitaxially grown.

A stripe-shaped insulating film 14 is formed on a center region of the upper cladding layer 5a. Using the stripe-shaped insulating film 14 as a mask, portions of the p type AlGaAs cap layer 6a and the AlGaInAs upper cladding layer 5a are selectively removed to form a stripe-shaped ridge 20. On the surface of the AlGaInAs upper cladding layer 5a exposed by the etching, the n type $Ga_{1-y}In_yAs$ (y=0.1) current blocking layer is grown, contacting the opposite sides of the ridge 20.

After removal of the insulating film 14, the p type $Ga_{1-y}In_yAs$ (y=0.1) contact layer 11a is grown on the p type AlGaAs cap layer 6a and on the n type GaInAs current blocking layer 5a.

Finally, the electrode 13 is formed on the rear surface of the side of the GaAs substrate 1a and the electrode 11 is formed on the GaInAs contact layer 11a to complete the laser device of the present invention. A description is given of the function of the semiconductor laser device according to the first embodiment of the present invention.

When the InGaAs buffer layer 2a, the AlGaInAs lower cladding layer 3a, the AlGaInAs guide layer 9a, the AlGaAs well layer 7a, the AlGaInAs barrier layer 8a, the AlGaAs well layer 7a, the AlGaInAs barrier layer 8a, the AlGaAs well layer 7a, the AlGaInAs guide layer 9a, and the AlGaInAs upper cladding layer 5a, and the p type GaInAs cap layer 6a are epitaxially grown on the n type $In_yGa_{1-y}As$ (y=0.1) substrate 1a, in the laminated structure, the lattice constants and the strains are as follows:

(1) the GaInAs substrate 1a: lattice constant 5.70, strain 0%

(2) the AlGaInAs lower cladding layer 3a: lattice constant 5.70, strain 0%

(3) the guide layer 9a of the quantum well active layer 4a: lattice constant 5.70, strain 0%

(4) the well layer 7a of the quantum well active layer 4a: lattice constant 5.65, strain 0.09%

(5) the barrier layer 8a of the quantum well active layer 4a: lattice constant 5.70, strain 0%

(6) the AlGaInAs upper cladding layer 5a: lattice constant 5.70, strain 0%.

In these layers, in the relationship between strain and thickness, strain increases with a reduction in thickness. In this first embodiment, the thickness of the well layer 7a is reduced to about 5 nm to introduce a large strain into the well layers 7a.

As described above, in the semiconductor laser device according to this first embodiment, the upper cladding layer 3a comprising $(Al_xGa_{1-x})_{1-y}In_yAs$ (x~0.6, y~0.1), that has the composition of a point at which the line L2 and the line of x=0.6 in FIG. 12 intersect, lattice-matches with $Ga_{1-y}In_yAs$ and is disposed on the $Ga_{1-y}In_yAs$ (y=0.1) substrate 1a. The guide layer 9a and barrier layer 8a of the triple-quantum well active layer 4a disposed on the upper cladding layer 3a comprise $(Al_rGa_{1-r})_{1-s}In_sAs$ (r~0.4, s~0.1), the composition at a point at which the line L2 and the line of x=0.4 in FIG. 8 intersect, that lattice-matches with the n type $Ga_{1-y}In_yAs$ (y=0.1). The well layer 7a sandwiched by the guide layer and the barrier layer comprises $Al_zGa_{1-z}As$ (z~0.1) having a lattice constant smaller than the lattice constants of the other crystals, whereby the well layer 7a is subjected to a tensile strain of 0.09% by the barrier layer 8a and the guide layer 9a. As a result, a strained quantum well structure including a tensile strain is produced in a laser diode employing an As series material.

As described above, in this first embodiment of a semiconductor laser device, by the addition of In to the layers from the GaAs substrate to the guide layers and the barrier layers in the active layer, the lattice constant of the well layer of the quantum well active layer is made different from the lattice constant of the barrier layer and the guide layer of the quantum well active layer and applies a tensile strain to the well layer. As described with respect to the prior art, strained quantum well lasers including well layers to which a compressive strain is applied have been fabricated since the fabrication process is relatively simple. In this first embodiment of the invention, it is possible to fabricate a strained quantum well laser to which not a compressive strain but a tensile strain is applied only by employing As series materials without employing a P series crystal which would make the fabrication difficult.

Further, as described in the prior art literature, when a compressive strain is applied to the well layer of the quantum well active layer, the threshold current is lowered by reducing the effective masses of holes in the active layer, whereby high efficiency and high-power output are obtained. Likewise, in this first embodiment of the invention, by the application of a tensile strain to the well layer of the quantum well active layer, the effective mass of holes in the active layer is reduced, whereby low threshold current, high efficiency, and high-power output are achieved. As a result, the characteristics of the laser are significantly improved.

In addition, the GaAs substrate, the upper and lower cladding layers 3a and 5a, and the barrier layers 8a and the guide layers 9a, to which layers In atoms are added, have a low dislocation density, thereby significantly lowering the proliferation (growth speed) of dislocations and significantly reducing the generation and growth of dark line defects (DLDs) due to the dislocations as shown in FIG. 13. The significant lowering of the proliferation of dislocations suppresses fast deterioration due to the generation and growth of DLDs and prevents sudden deterioration due to DLD and DSD and oxidation and catastrophic optical damage (COD) at facets due to the sudden deterioration. Further, slow deterioration due to DSD and deep levels is also suppressed. As a result, a strained quantum well semiconductor laser with high reliability and a long lifetime is obtained.

In addition, since the thicknesses and the compositions of the well layers, the barrier layers, the light confining layers, and the upper and lower cladding layers are set as described above, a tensile strain quantum well laser employing a GaAs substrate is critically produced without various kinds of defects, whereby a laser structure that has previously been only theoretically possible is realized as an actual device. This first embodiment of the invention providing an actual device has a great utility in industry.

EMBODIMENT 2

Figure 2:
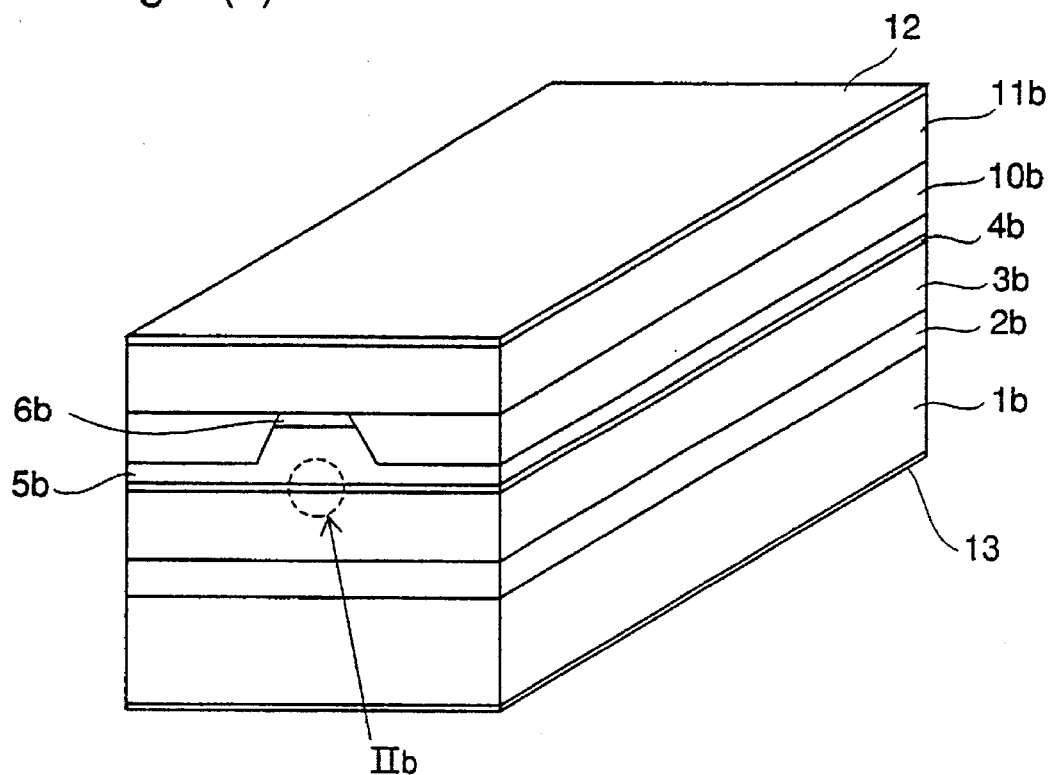
FIG. 2(a) is a perspective view illustrating a semiconductor laser device according to a second embodiment of the present invention.
FIG. 2(b) is an enlarged view of a part of the structure shown in FIG. 2(a).
Figure 2:
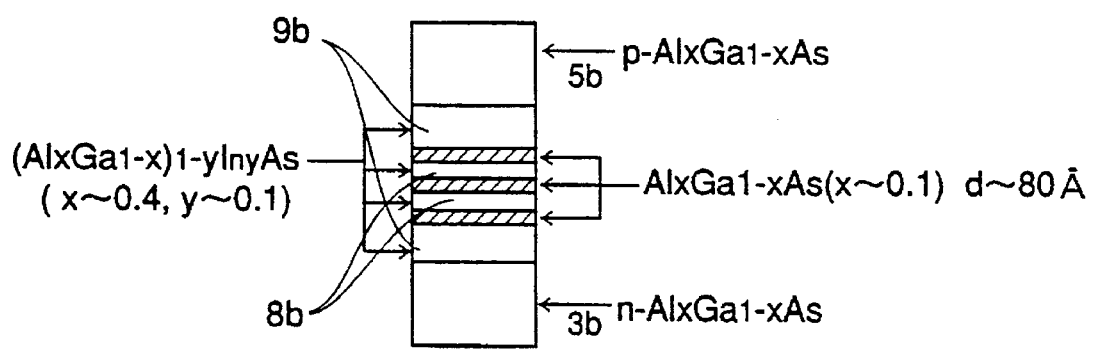
Figure 7:
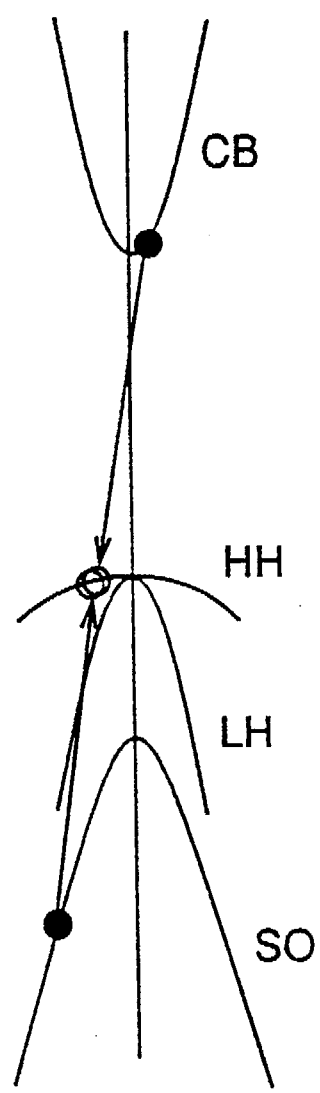
FIG. 7 is a diagram illustrating Auger recombination.

FIGS. 2(a) and 2(b) are diagrams illustrating a semiconductor laser device according to a second embodiment of the invention. An n type GaAs buffer layer 2b 0.5~1.0 μm thick is disposed on an n type GaAs substrate 1b. An n type $Al_xGa_{1-x}As$ (x~0.5) lower cladding layer 3b 1.5~2.0 μm thick is disposed on the n type GaAs buffer layer 2b. An active layer 4b having a triple-quantum well structure is disposed on the n type $Al_xGa_{1-x}As$ (x~0.5) lower cladding layer 3b. This active layer 4b comprises three $Al_zGa_{1-z}As$ (z~0.1) well layers 7b 5~10 nanometers thick, two $(Al_rGa_{1-r})_{1-s}In_sAs$ (r~0.4, s~0.1) barrier layers 8b 5~10 nanometers thick, and $(Al_rGa_{1-r})_{1-s}In_sAs$ (r~0.4, s~0.1) guide layers 9b 10–30 nanometers thick.

Further, a p type $Al_xGa_{1-x}As$ (x~0.5) upper cladding layer 5b is disposed on the triple-quantum well active layer 4a. The upper cladding layer 5b has a convex-shaped ridge in the center of the structure. A p type GaAs cap layer 6b is disposed on the ridge of the upper cladding layer 5b. N type GaAs current blocking layers 10b are disposed on the p type $Al_xGa_{1-x}As$ (x~0.5) upper cladding layers 5b, contacting opposite sides of the ridge. A p type contact layer 11b is disposed on the p type GaAs cap layer 6b and on the n type GaAs current blocking layers 10b.

A method of fabricating a semiconductor laser device according to this second embodiment is similar to the method according to the first embodiment. In this second embodiment, an n type GaAs buffer layer 2b 0.5~1.0 μm thick, an n type $Al_xGa_{1-x}As$ (x~0.5) lower cladding layer 3b 1.5~2.0 μm thick, a triple-quantum well active layer 4b comprising $Al_zGa_{1-z}As$ (z~0.1) well layers 7b 5~10 nanometers thick, $(Al_rGa_{1-r})_{1-s}In_sAs$ (r~0.4, s~0.1) barrier layers 8b 5~10 nanometers thick, and $(Al_rGa_{1-r})_{1-s}In_sAs$ (r~0.4, s~0.1) guide layers 9b 10–30 nanometers thick, a p type $Al_xGa_{1-x}As$ (x~0.5) upper cladding layer 5b 1.5~2.0 μm thick, and a p type GaAs cap layer 6b are successively epitaxially grown on an n type GaAs substrate 1b. The lattice constants and the strains of the respective semiconductor layers in the laminated structure are as follows:

(1) the GaAs substrate 1b: lattice constant 5.65, strain 0%

(2) the AlGaAs lower cladding layer 3b: lattice constant 5.66, strain 0%

(3) the guide layer 9b of the quantum well active layer: lattice constant 5.70, strain 0.1~0.5%

(4) the well layer 7b of the quantum well active layer: lattice constant 5.65, strain 0.1~0.5%

(5) the barrier layer 8b of the quantum well active layer: lattice constant 5.70, strain 0.1~0.5%

(6) the AlGaAs upper cladding layer 3b: lattice constant 5.66, strain 0%.

Here, the well layer 7b is subjected to a strain as large as strains applied to the guide layer 9a and the barrier layer 8a from the upper and lower cladding layers 3b and 5b.

The relationship between the strain and the thickness is that the strain is increased as the thickness is reduced. In this second embodiment, when the thicknesses of the guide layer 9a and the barrier layer 8b are about 10 nm and 5 nm, respectively, a large strain is applied to these layers.

In the semiconductor laser device according to this second embodiment of the invention, after growing the n type GaAs buffer layer 2b and the n type $Al_xGa_{1-x}As$ (x~0.5) lower cladding layer 3b that lattice-matches with GaAs, the guide layers 9b and the barrier layers 8b of the triple-quantum well active layer 4b both comprising $(Al_rGa_{1-r})_{1-s}In_sAs$ (r~0.4, s~0.1) to which In is added are grown, whereby a tensile strain of 0.1~0.5% is applied to the barrier layers and the guide layers and an equivalent tensile strain of 0.1~0.5% is also applied to the well layers due to the difference between the lattice constant of the $Al_xGa_{1-x}As$ (x~0.5) upper and lower cladding layers 3b and 5b and the lattice constant of the $(Al_rGa_{1-r})_{1-s}In_sAs$ (r~0.4, s~0.1) guide layers 9b and barrier layers 8b.

In this second embodiment, by the addition of In to the guide layers and the barrier layers of the quantum well active layer, the lattice constant of the upper and lower AlGaAs cladding layers is made different from the lattice constant of the barrier layer and the guide layer of the quantum well active layer and applies a tensile strain to the barrier layers, the guide layers, and the well layers. As described with respect to the prior art, strained quantum well lasers including well layers to which a compressive strain is applied have been fabricated since the fabrication process is relatively simple. In this second embodiment of the invention, it is possible to fabricate a strained quantum well laser to which not a compressive strain but a tensile strain is applied by employing only As series materials without employing P series materials which would make the fabrication difficult.

Further, as described in the prior art, when a compressive strain is applied to the quantum well active layer, the threshold current is lowered by the effect of reducing the effective mass of holes in the active layer, whereby high efficiency and high-power output are obtained. Likewise, in this second embodiment of the invention, by the application of a tensile strain to the well layer of the quantum well active layer, the effective mass of holes in the active layer is reduced, whereby low threshold current, high efficiency, and high-power output are achieved. As a result, the characteristics of the laser are significantly improved.

In addition, the barrier layers and the guide layers, to which In is added, have a low dislocation density, significantly lowering proliferation (growth speed) of dislocations and significantly reducing the generation and growth of DLDs due to the dislocations, as shown in FIG. 13. The significant lowering of the proliferation of dislocations suppresses fast deterioration due to the generation and growth of DLDs and prevents sudden deterioration due to the DLDs and DSD and oxidation and COD at facets due to the sudden deterioration. Further, slow deterioration due to the DSD and deep levels is also suppressed. As a result, a strained quantum well semiconductor laser with high reliability and long lifetime is obtained.

In addition, since the thicknesses and the compositions of the well layers, the barrier layers, the light confining layers, and the upper and lower cladding layers are set as described above, a tensile strain quantum well laser employing a GaAs substrate is critically produced without various kinds of defects, whereby a laser structure that has previously been only theoretically possible is realized as an actual device. This second embodiment of the invention providing an actual device has a great practical utility.

While in the first and second embodiments the lower cladding layer 3a or 3b is disposed on the buffer layer 2a or 2b on the substrate 1a or 1b, the buffer layer may be dispensed with, i.e., the lower cladding layer may be directly disposed on the substrate 1a or 1b.

EMBODIMENT 3

While emphasis has been placed upon ridge type semiconductor laser devices in the first and second embodiments, the present invention may also be applied to SAS (Self Alignment Structure) lasers.

FIG. 14 shows a SAS type semiconductor laser device according to a third embodiment of the present invention. In the FIG., reference numeral 1a designates an n type $Ga_{1-y}In_yAs$ (y=0.1) substrate. An n type $(Al_xGa_{1-x})_{1-y}In_yAs$ (x~0.6, y~0.1) lower cladding layer 3a is disposed on the n type $Ga_{1-y}In_yAs$ (y=0.1) substrate 1. A triple-quantum well active layer 4a is disposed on the $(Al_xGa_{1-x})_{1-y}In_yAs$ lower cladding layer 3a. This active layer 4a comprises three $Al_zGa_{1-z}As$ (z~0.4) well layers 7a, two $(Al_rGa_{1-r})_{1-s}In_sAs$ (r~0.4, s~0.1) barrier layers 8a, and two $(Al_rGa_{1-r})_{1-s}In_sAs$ (r~0.4, s~0.1) guide layers 9a. A first p type $(Al_xGa_{1-x})_{1-y}In_yAs$ (x~0.6, y~0.1) upper cladding layer 15a is disposed on the active layer 4a. Current blocking layers 10a are disposed on the p type upper cladding layer 15a except a central stripe-shaped region of the upper cladding layer 15a. A second upper cladding layer 15b is disposed on the stripe-shaped region of the first upper cladding layer 15a and on the current blocking layers 10a. The n type $Ga_{1-y}In_yAs$ (y=0.1) current blocking layers 10a sandwiching a portion of the second upper cladding layer 15b provide a current confining structure. A p type $Ga_{1-y}In_yAs$ (y=0.1) contact layer 11a is disposed on the p type $(Al_xGa_{1-x})_{1-y}In_yAs$ (x~0.6, y~0.1) upper cladding layer 15b.

In this third embodiment, the thicknesses, lattice constants, and strains of the respective layers are the same as those described in the first embodiment. Also, in the SAS type semiconductor laser device according to this third embodiment, the same effects as described in the first and second embodiments are obtained. The SAS structure according to this third embodiment may be applied to the first and the second embodiments.

While in the described embodiments of the invention a GaAs substrate to which In is added is employed, a GaAs substrate to which B (boron) is added may be employed with the same effects as described above. More particularly, a GaAs substrate fabricated by the VCZ (Vertical Czochralski) method that includes boron ensures a longer lifetime laser diode than a laser employing a GaAs substrate fabricated by HB (Horizontal Bridgeman) method. cmcg

What is claimed is:

1. A semiconductor laser device comprising:
   a semiconductor substrate;
   upper and lower cladding layers, each of the upper and lower cladding layers comprising a composition lattice-matching with the semiconductor substrate, said lower cladding layer being disposed on the semiconductor substrate; and
   an active layer having a quantum well structure interposed between the upper and lower cladding layers and comprising alternating well layers and barrier layers and outermost guide layers, the layers of the active layer being arranged so that each well layer is sandwiched by two of the barrier layers and the guide layers sandwich the alternating well layers and barrier layers, wherein the guide layers lattice-match with the upper and lower cladding layers, the well layers have a lattice constant different from the lattice constant of the barrier layers, thereby applying a tensile strain to each of the well layers, and each of the upper and lower cladding layers, the guide layers, and the barrier layers include In, and the well layers are free of In.

2. The semiconductor laser device of claim 1 wherein the lattice constant of the well layers is different from the lattice constant of the guide layers.

3. The semiconductor laser device of claim 1 wherein each of the semiconductor substrate and the upper and lower cladding layers include a dopant impurity and the well layers are undoped.

4. The semiconductor laser device of claim 1 wherein:

the semiconductor substrate comprises an n type InGaAS body and an n type $In_yGa_{1-y}As$ ($0.05 \leq y \leq 0.2$) layer on the n type InGaAs body;

the upper and lower cladding layers comprise n type and p type $(Al_xGa_{1-x})_{1-y}In_yAs$ ($x\sim 0.6$, $y\sim 0.1$), respectively, which lattice match with the n type InGaAs layer;

the barrier and guide layers of the active layer comprise $(Al_xGa_{1-x})_{1-y}In_yAs$ ($x\sim 0.4$, $y\sim 0.1$) which lattice-match with the lower and upper cladding layers; and the well layers comprise $Al_xGa_{1-x}As$ ($0 \leq x \leq 0.15$).

5. The semiconductor laser device of claim 1 wherein the semiconductor substrate, the upper and lower cladding layers, and the active layer are free of phosphorus.

6. A semiconductor laser device comprising:

a semiconductor substrate;

upper and lower cladding layers, each of the upper and lower cladding layers comprising a composition lattice-matching with the semiconductor substrate, said lower cladding layer being disposed on the semiconductor substrate; and an active layer having a quantum well structure interposed between the upper and lower cladding layers and comprising alternating well layers and barrier layers and outermost guide layers, the layers of the active layer being arranged so that each well layer is sandwiched by two of the barrier layers and the guide layers sandwich the alternating well layers and barrier layers, wherein the well layers lattice-match with the upper and lower cladding layers, the well layers have a lattice constant different from the lattice constant of the barrier layers sandwiching each of the well layers, thereby applying a tensile strain to each of the well layers, and each of the upper and lower cladding layers, the guide layers, and the barrier layers include In, and the well layers are free of In.

7. The semiconductor laser device of claim 6 wherein the lattice constant of the upper and lower cladding layers is different from the lattice constant of the guide layers.

8. The semiconductor laser device of claim 6 wherein each of the semiconductor substrate and the upper and lower cladding layers include a dopant impurity and the well layers are undoped.

9. The semiconductor laser device of claim 6 wherein:

the semiconductor substrate comprises n type GaAs;

the upper and lower cladding layers comprise n type $Al_xGa_{1-x}As$ ($x\sim 0.5$) lattice matching with the n type GaAs substrate;

the barrier layers and the guide layers comprise $(Al_xGa_{1-x})_{1-y}In_yAs$ ($0.3<x<0.5$, $0.05<y<0.15$); and the well layers comprise $Al_xGa_{1-x}As$ ($0 \leq x \leq 0.15$).

10. The semiconductor laser device of claim 6 wherein the semiconductor substrate, the upper and lower cladding layers, and the active layer are free of phosphorus.

* * * * *

UNITED STATES PATENT AND TRADEMARK OFFICE
CERTIFICATE OF CORRECTION

PATENT NO.    : 5,644,587
DATED         : July 1, 1997
INVENTOR(S)   : Kaneno et al.

It is certified that error appears in the above-indentified patent and that said Letters Patent is hereby corrected as shown below:

Column 15, Line 21, change "InGaAS" to --InGaAs--;

Column 16, Line 32, change "(0.3<x<0.5, 0.05<y<0.15"

to --(0.3≤x≤0.5, 0.05≤y≤0.15--.

Signed and Sealed this

Sixteenth Day of December, 1997

Attest:

BRUCE LEHMAN

Attesting Officer

Commissioner of Patents and Trademarks